(12) United States Patent
Wu et al.

(10) Patent No.: US 12,255,111 B2
(45) Date of Patent: Mar. 18, 2025

(54) MULTIPLE-LEVEL INTERCONNECT STRUCTURE AND MANUFACTURING METHOD THEREOF

(71) Applicant: United Microelectronics Corp., Hsinchu (TW)

(72) Inventors: Jia Fang Wu, Chiayi (TW); Hsiang-Chieh Yen, Penghu County (TW); Hsu-Sheng Huang, Kaohsiung (TW); Zhi Jian Wang, Tainan (TW)

(73) Assignee: United Microelectronics Corp., Hsinchu (TW)

( * ) Notice: Subject to any disclaimer, the term of this patent is extended or adjusted under 35 U.S.C. 154(b) by 239 days.

(21) Appl. No.: 17/394,197

(22) Filed: Aug. 4, 2021

(65) Prior Publication Data

US 2022/0415724 A1    Dec. 29, 2022

(30) Foreign Application Priority Data

Jun. 29, 2021 (CN) .......................... 202110726462.1

(51) Int. Cl.
*H01L 21/66* (2006.01)
*H01L 23/522* (2006.01)

(52) U.S. Cl.
CPC .............. *H01L 22/30* (2013.01); *H01L 22/12* (2013.01); *H01L 23/5226* (2013.01)

(58) Field of Classification Search
None
See application file for complete search history.

(56) References Cited

U.S. PATENT DOCUMENTS

| 6,967,349 B2 | 11/2005 | Bonifield et al. |
| 9,252,060 B2 * | 2/2016 | Tsai ........................ H01L 22/30 |

FOREIGN PATENT DOCUMENTS

| CN | 1279583 | 10/2006 |
| CN | 101853802 | 10/2010 |
| CN | 103367316 | 6/2016 |

* cited by examiner

*Primary Examiner* — Jack S Chen
(74) *Attorney, Agent, or Firm* — J.C. PATENTS

(57) ABSTRACT

Provided are a multiple-level interconnect structure having a scatterometry test layer and a manufacturing method thereof. The multiple level interconnect structure includes a patterned reflective layer, a bulk reflective layer and a patterned test layer. The patterned reflective layer is disposed on a substrate and includes a first reflective pattern and a second reflective pattern separated from each other. The bulk reflective layer is disposed on the patterned reflective layer. The patterned test layer is disposed on the bulk reflective layer.

7 Claims, 10 Drawing Sheets

MULTIPLE-LEVEL INTERCONNECT STRUCTURE AND MANUFACTURING METHOD THEREOF

CROSS-REFERENCE TO RELATED APPLICATION

This application claims the priority benefit of China application serial no. 202110726462.1, filed on Jun. 29, 2021. The entirety of the above-mentioned patent application is hereby incorporated by reference herein and made a part of this specification.

BACKGROUND

Technical Field

The present invention relates to a semiconductor device and a manufacturing method thereof, and particularly to a multi-level interconnect structure with a scatterometry test layer and a manufacturing method thereof.

Description of Related Art

In the current semiconductor process, an optical critical dimension (OCD) measurement is usually performed on the device to be tested in the test region. Generally speaking, when performing the optical critical dimension measurement, light is irradiated to the test region, and the measurement is performed based on the reflected light. However, when light enters to a layer under the device to be tested, the reflected light may carry noise from the layer under the device to be tested, which affects the measurement accuracy.

In order to prevent the reflected light from carrying noise from the layer under the device to be tested, a bulk reflective layer is usually disposed under the device to be tested to prevent light from entering to the layer under the device to be tested. However, as the size of the semiconductor devices continue to be miniaturized and thinned, the thickness of the bulk reflective layer continues to decrease, resulting in a light leakage problem, which affects the measurement accuracy. In addition, when the thickness of the bulk reflective layer is too thin, dishing will occur in the subsequent polishing process, which may affect the reflection effect.

SUMMARY

The present invention provides a multi-level interconnect structure, in which a patterned reflective layer including a first reflective pattern and a second reflective pattern separated from each other is disposed under a bulk reflective layer.

The present invention provides a manufacturing method of a multi-level interconnect structure, in which a patterned reflective layer including a first reflective pattern and a second reflective pattern separated from each other is formed under a bulk reflective layer.

A multi-level interconnect structure of the present invention includes a patterned reflective layer, a bulk reflective layer and a patterned test layer. The patterned reflective layer is disposed on a substrate and includes a first reflective pattern and a second reflective pattern separated from each other. The bulk reflective layer is disposed on the patterned reflective layer. The patterned test layer is disposed on the bulk reflective layer.

In an embodiment of the multi-level interconnect structure of the present invention, the first reflective pattern includes a plurality of strip patterns arranged in parallel, the second reflective pattern includes a plurality of conductive via patterns, and the conductive via patterns are located between two adjacent strip patterns.

In an embodiment of the multi-level interconnect structure of the present invention, a plurality of columns of the conductive via patterns are disposed between two adjacent strip patterns.

In an embodiment of the multi-level interconnect structure of the present invention, the first reflective pattern includes a bulk pattern having a plurality of openings, the second reflective pattern includes a plurality of conductive via patterns, and the plurality of conductive via patterns are located in the plurality of openings.

In an embodiment of the multi-level interconnect structure of the present invention, the first reflective pattern includes a plurality of first conductive via patterns, the second reflective pattern includes a plurality of second conductive via patterns, and the aperture of the plurality of first conductive via patterns and the aperture of the plurality of second conductive via patterns are different from each other.

In an embodiment of the multi-level interconnect structure of the present invention, the patterned reflective layer further includes a third reflective pattern, the first reflective pattern includes a plurality of first conductive via patterns, the second reflective pattern includes a plurality of second conductive via patterns, the third reflective pattern includes a plurality of third conductive via patterns, and the aperture of the plurality of first conductive via patterns, the aperture of the plurality of second conductive via patterns and the aperture of the plurality of third conductive vias are different from each other.

In an embodiment of the multi-level interconnect structure of the present invention, a ratio of the projected area of the patterned reflective layer on the substrate to the projected area of the bulk reflective layer on the substrate is between 0.75 and 0.90.

In an embodiment of the multi-level interconnect structure of the present invention, a material of the patterned reflective layer includes metal.

In an embodiment of the multi-level interconnect structure of the present invention, a material of the bulk reflective layer includes metal.

In an embodiment of the multi-level interconnect structure of the present invention, the bulk reflective layer is located directly under the patterned test layer, and the patterned reflective layer is located directly under the bulk reflective layer.

In an embodiment of the multi-level interconnect structure of the present invention, a dielectric layer is further disposed between the bulk reflective layer and the patterned test layer.

In an embodiment of the multi-level interconnect structure of the present invention, a dielectric layer is further disposed between the first reflective pattern and the second reflective pattern.

A manufacturing method of a multi-level interconnect structure of the present invention includes the following steps. A patterned reflective layer is formed on a substrate, wherein the patterned reflective layer includes a first reflective pattern and a second reflective pattern separated from each other. A bulk reflective layer is formed on the patterned reflective layer. A patterned test layer is formed on the bulk reflective layer.

In an embodiment of the manufacturing method of the multi-level interconnect structure of the present invention, the first reflective pattern includes a plurality of strip patterns arranged in parallel, the second reflective pattern includes a plurality of conductive via patterns, and the conductive via patterns are located between two adjacent strip patterns.

In an embodiment of the manufacturing method of the multi-level interconnect structure of the present invention, a plurality of columns of the conductive via patterns are disposed between two adjacent strip patterns.

In an embodiment of the manufacturing method of the multi-level interconnect structure of the present invention, the first reflective pattern includes a bulk pattern having a plurality of openings, the second reflective pattern includes a plurality of conductive via patterns, and the plurality of conductive via patterns are located in the plurality of openings.

In an embodiment of the manufacturing method of the multi-level interconnect structure of the present invention, the first reflective pattern includes a plurality of first conductive via patterns, the second reflective pattern includes a plurality of second conductive via patterns, and the aperture of the plurality of first conductive via patterns and the aperture of the plurality of second conductive via patterns are different from each other.

In an embodiment of the manufacturing method of the multi-level interconnect structure of the present invention, the patterned reflective layer further includes a third reflective pattern, the first reflective pattern includes a plurality of first conductive via patterns, the second reflective pattern includes a plurality of second conductive via patterns, the third reflective pattern includes a plurality of third conductive via patterns, and the aperture of the plurality of first conductive via patterns, the aperture of the plurality of second conductive via patterns and the aperture of the plurality of third conductive vias are different from each other.

In an embodiment of the manufacturing method of the multi-level interconnect structure of the present invention, a ratio of the projected area of the patterned reflective layer on the substrate to the projected area of the bulk reflective layer on the substrate is between 0.75 and 0.90.

In an embodiment of the manufacturing method of the multi-level interconnect structure of the present invention, the bulk reflective layer is located directly under the patterned test layer, and the patterned reflective layer is located directly under the bulk reflective layer.

In an embodiment of the manufacturing method of the multi-level interconnect structure of the present invention, a dielectric layer is further formed on the bulk reflective layer after forming the bulk reflective layer and before forming the patterned test layer.

In an embodiment of the manufacturing method of the multi-level interconnect structure of the present invention, a dielectric layer is further formed between the first reflective pattern and the second reflective pattern.

Based on the above, in the multi-level interconnect structure having a scatterometry test layer of present invention, since the patterned reflective layer and the bulk reflective layer are located under the patterned test layer (as the scatterometry test layer) as a reflective structure, during the optical critical dimension measurement, when the light enters to the region under the patterned test layer, the light may be directly reflected and may not carry noise from the lower layer to ensure measurement accuracy.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
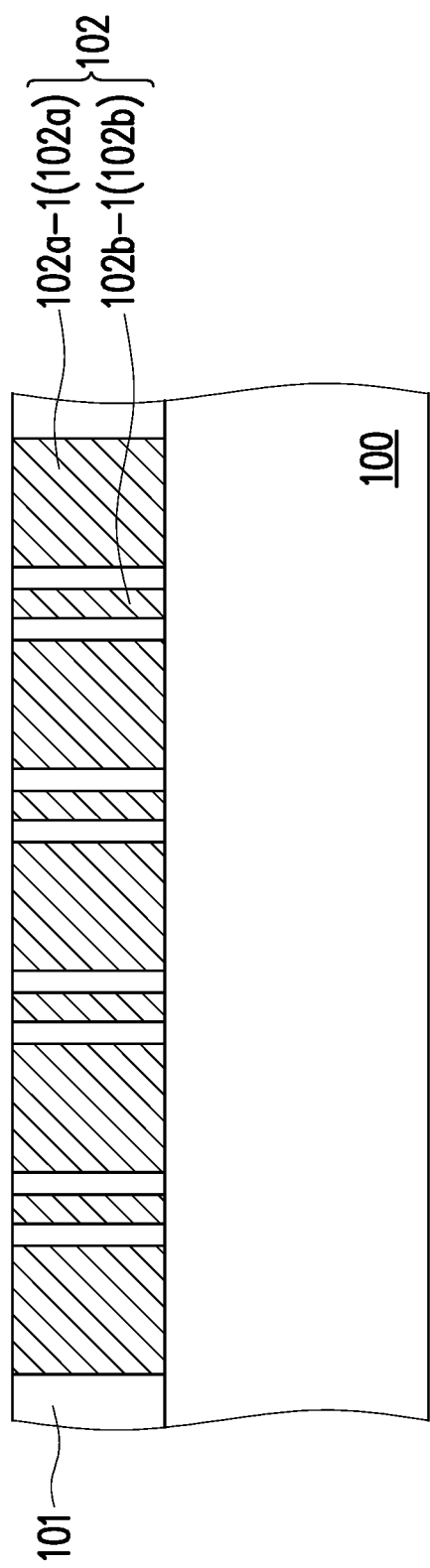
FIGS. 1A to 1C are schematic cross-sectional views of a manufacturing process of a multi-level interconnect structure drawn in accordance with a first embodiment of the present invention.

The embodiments are described in detail below with reference to the accompanying drawings, but the embodiments are not intended to limit the scope of the present invention. In addition, the drawings are for illustrative purposes only and are not drawn to the original dimensions. For the sake of easy understanding, the same elements in the following description will be denoted by the same reference numerals.

In the text, the terms mentioned in the text, such as "comprising", "including", "containing" and "having" are all open-ended terms, i.e., meaning "including but not limited to".

In addition, the directional terms, such as "on", "above", "under" and "below" mentioned in the text are only used to refer to the direction of the drawings, and are not used to limit the present invention.

When using terms such as "first" and "second" to describe elements, it is only used to distinguish the elements from each other, and does not limit the order or importance of the devices. Therefore, in some cases, the first element may also be called the second element, the second element may also be called the first element, and this is not beyond the scope of the present invention.

In the text, a range represented by "a value to another value" is a summary expression way to avoid listing all the values in the range one by one in the specification. Therefore, the record of a specific numerical range covers any numerical value within the numerical range, as well as a smaller numerical range defined by any numerical value within the numerical range.

Figure 1B:
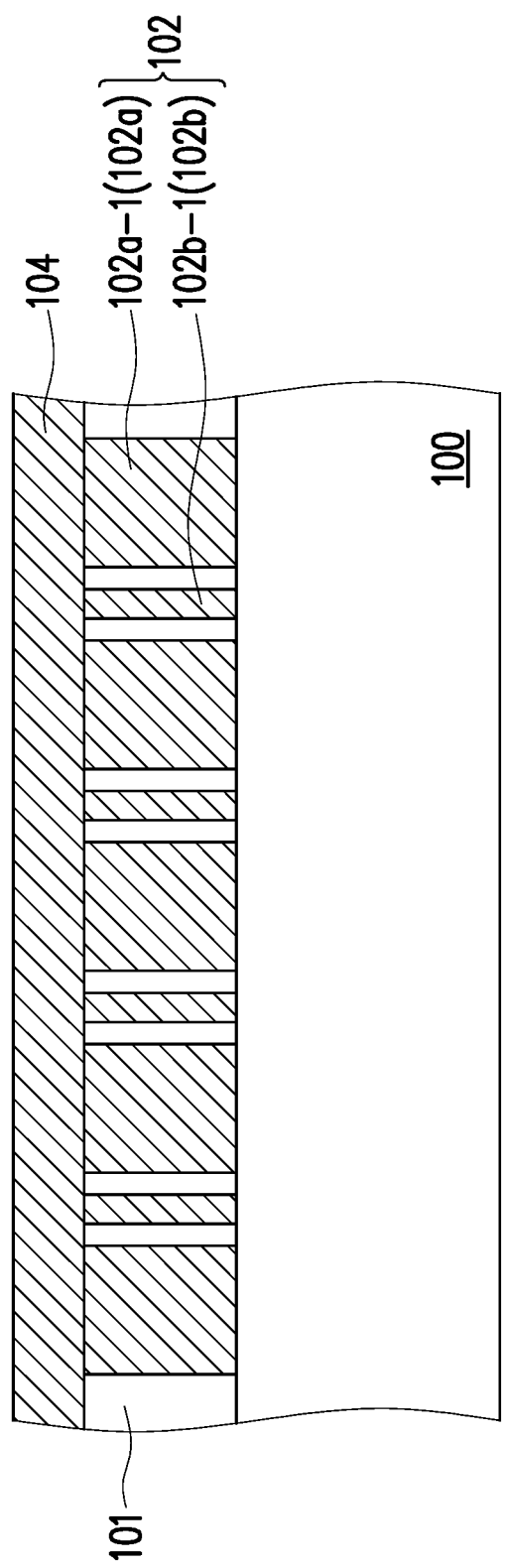
Figure 1C:
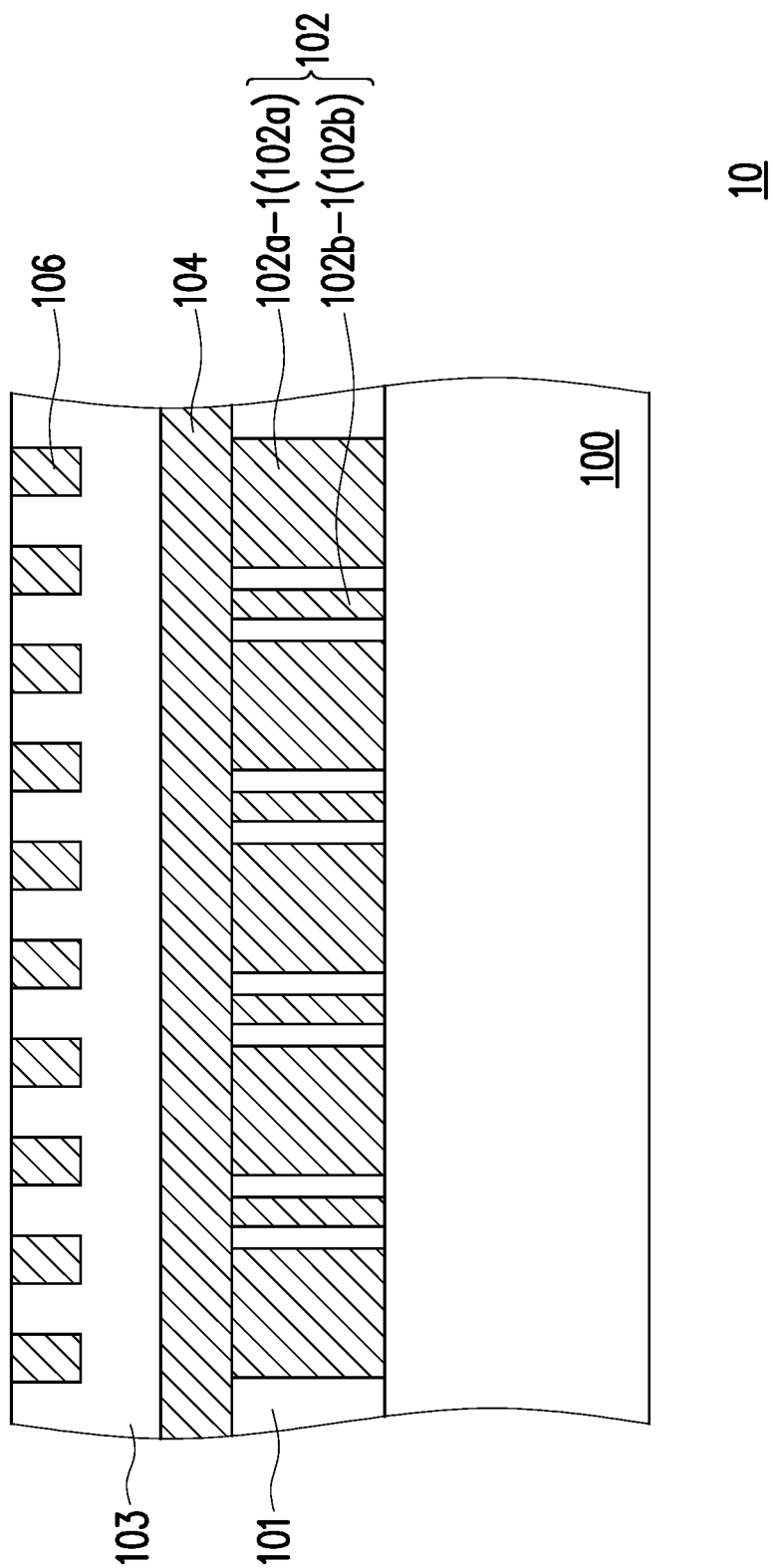

FIGS. 1A to 1C are schematic cross-sectional views of a manufacturing process of a multi-level interconnect structure drawn in accordance with a first embodiment of the present invention.

In the present embodiment, the device to be tested for the optical critical dimension measurement and the reflective device for improving the measurement accuracy are disposed in the test region of the substrate. In addition, the manufacturing of the device to be tested and the reflective device may be integrated with the manufacturing of the circuit structure in the device region of the substrate, but the present invention is not limited thereto. Therefore, in the present embodiment, the device to be tested and the reflective device in the test region and the circuit structure in the device region may be collectively referred to as a multi-level interconnect structure. The following will describe the formation of the device to be tested and the reflection device in the test region, and those skilled in the art should be able to clearly understand the formation of the circuit structure in the device region at the same time.

Referring to FIG. 1A, a substrate 100 is provided. In the present embodiment, the substrate 100 includes a silicon substrate, various semiconductor devices and circuit structures formed on the silicon substrate, and a dielectric layer covering the silicon substrate. In order to make the drawings clear and easy to explain, the above-mentioned various semiconductor devices, circuit structures and dielectric layers are not shown. Then, a dielectric layer 101 is formed on the substrate 100. In the device region, the dielectric layer 101 may be called an inter-layer dielectric layer. Next, a patterned reflective layer 102 is formed on the substrate 100. The material of the patterned reflective layer 102 is, for example, metal. The method of forming the patterned reflective layer 102 includes the following steps, for example. Openings are formed in the dielectric layer 101. Then, the openings are filled with a metal material layer. In the present embodiment, the steps of forming the patterned reflective layer 102 may be integrated with the steps of forming the conductive vias in the device region, but the present invention is not limited thereto.

Figure 2A:
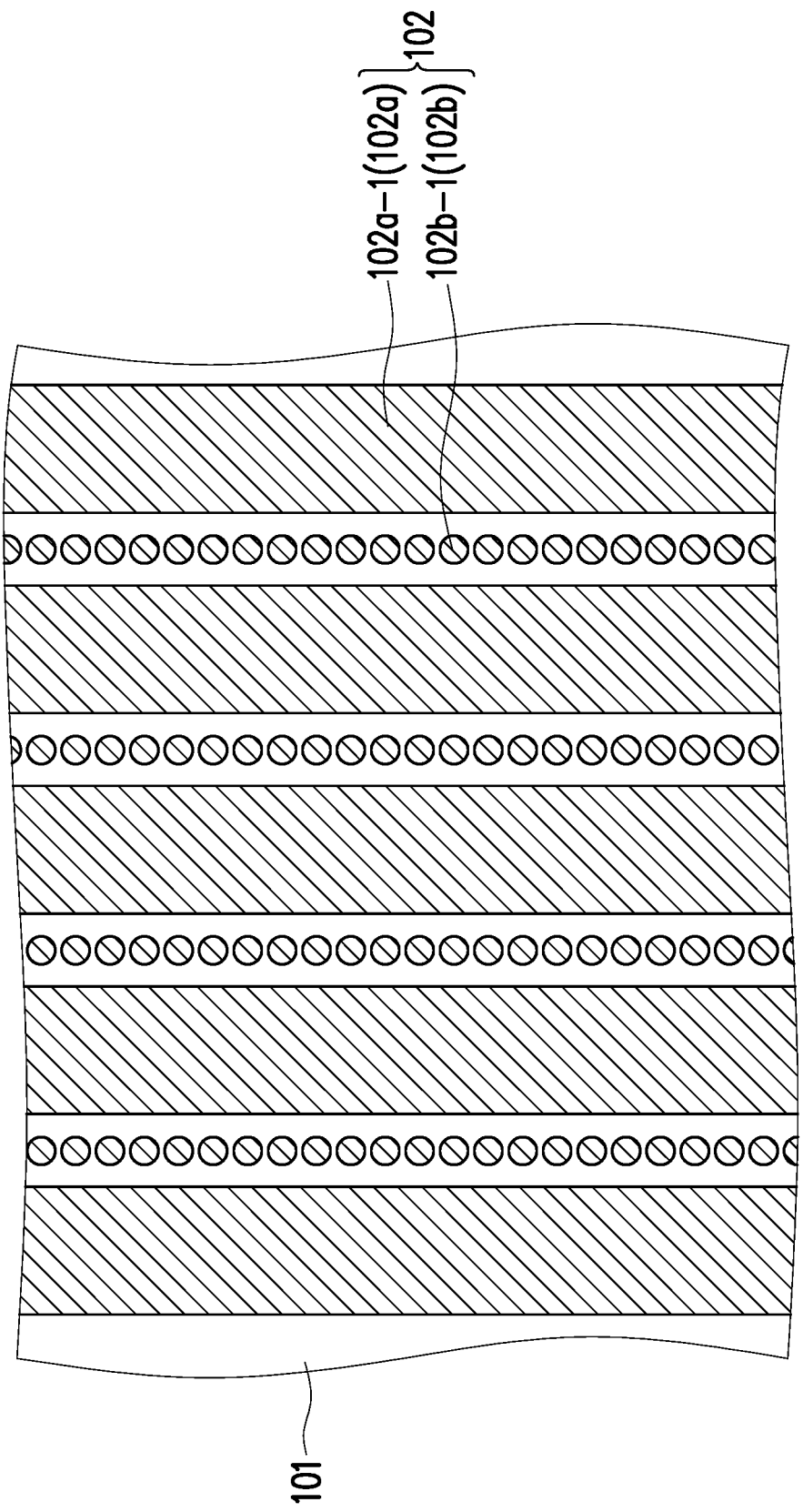
FIG. 2A is a schematic top view of a patterned reflective layer of a multi-level interconnect structure according to the first embodiment of the present invention.

In the present embodiment, the patterned reflective layer 102 includes a first reflective pattern 102a and a second reflective pattern 102b separated from each other by the dielectric layer 101. FIG. 2A is a schematic top view of the patterned reflective layer of the multi-level interconnect structure according to the present embodiment. As shown in FIG. 2A, in the present embodiment, the first reflective pattern 102a includes a plurality of parallel strip patterns 102a-1, and the second reflective pattern 102b includes a plurality of conductive via patterns 102b-1. The conductive via patterns 102b-1 are located between two adjacent strip patterns 102a-1. The conductive via patterns 102b-1 and the strip patterns 102a-1 are separated from each other by the dielectric layer 101. In the present embodiment, the conductive via patterns 102b-1 located between two adjacent strip patterns 102a-1 are arranged in one column, but the present invention is not limited thereto. In other embodiments, the conductive via patterns 102b-1 may be arranged in an irregular manner between two adjacent strip patterns 102a-1. In addition, in the present embodiment, these conductive via patterns 102b-1 have the same aperture, but the present invention is not limited thereto. In other embodiments, the conductive via patterns 102b-1 may have different apertures.

Figure 2B:
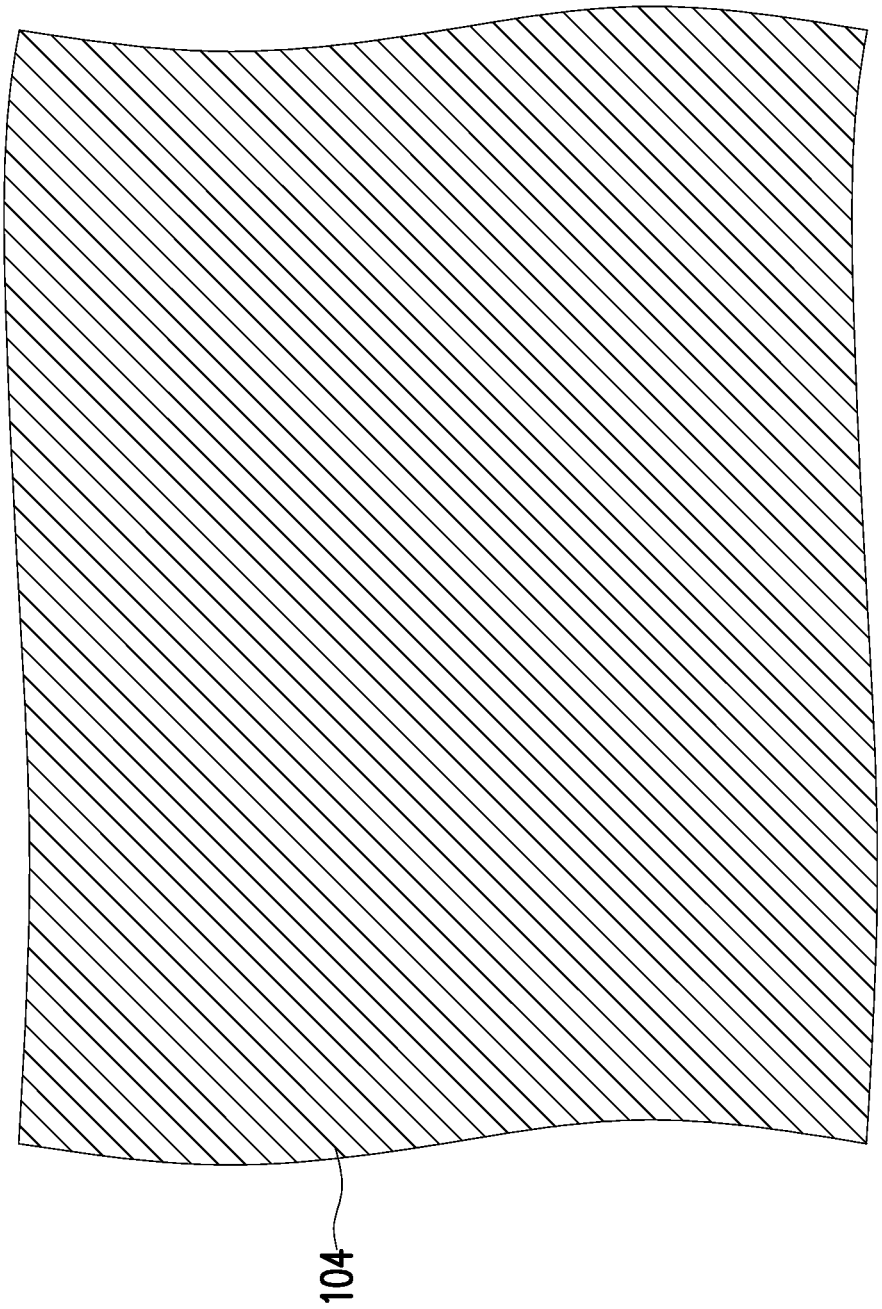
FIG. 2B is a schematic top view of a bulk reflective layer of a multi-level interconnect structure according to the first embodiment of the present invention.

Referring to FIG. 1B, a bulk reflective layer 104 is formed on the dielectric layer 101. The material of the bulk reflective layer 104 is, for example, metal. FIG. 2B is a schematic top view of the bulk reflective layer of the multi-level interconnect structure according to the present embodiment. As shown in FIG. 2B, the bulk reflective layer 104 has a large-area bulk structure on the dielectric layer 101. The method of forming the bulk reflective layer 104 includes the following steps, for example. A metal material layer is formed on the dielectric layer 101. Then, a patterning process is performed on the metal material layer. The material of the bulk reflective layer 104 may be the same as or different from the material of the patterned reflective layer 102, which is not limited by the present invention. In the present embodiment, the steps of forming the bulk reflective layer 104 may be integrated with the steps of forming the circuit layer in the device region, but the present invention is not limited thereto. In the present embodiment, the bulk reflective layer 104 is in contact with the patterned reflective layer 102, but the present invention is not limited thereto. In other embodiments, depending on actual needs, the bulk reflective layer 104 and the patterned reflective layer 102 may be separated by a dielectric layer.

Figure 2C:
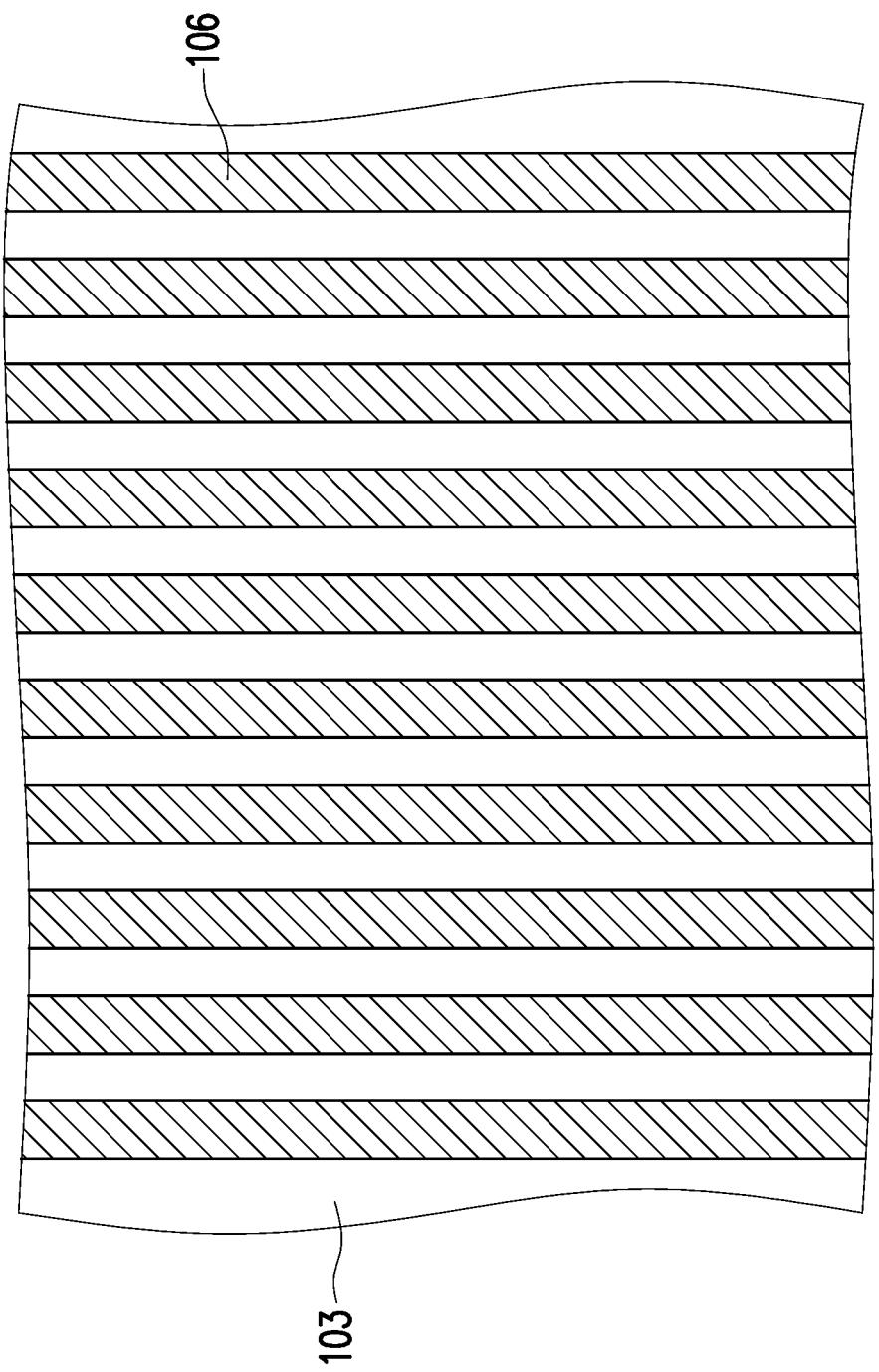
FIG. 2C is a schematic top view of a patterned test layer of a multi-level interconnect structure according to the first embodiment of the present invention.

Referring to FIG. 1C, a dielectric layer 103 is formed on the bulk reflective layer 104. In the present embodiment, the dielectric layer 103 is the same as the dielectric layer 101. In the device region, the dielectric layer 103 and the dielectric layer 101 may be regarded as an integral inter-layer dielectric layer. Then, a patterned test layer 106 is formed on the bulk reflective layer 104 to serve as a scatterometry test layer. The material of the patterned test layer 106 is, for example, metal. FIG. 2C is a schematic top view of the patterned test layer of the multi-level interconnect structure according to the present embodiment. As shown in FIG. 2C, in the present embodiment, the patterned test layer 106 includes a plurality of parallel strip patterns, but the present invention is not limited thereto. In other embodiments, the patterned test layer 106 may have other patterns according to actual needs. The method of forming the patterned test layer 106 includes the following steps, for example. Trenches are formed in the dielectric layer 103. Then, the trenches are filled with a metal material layer. In the present embodiment, the steps of forming the patterned test layer 106 may be integrated with the steps of forming the circuit layer in the device region, but the present invention is not limited thereto. In this way, the multi-level interconnect structure 10 of the present embodiment is formed.

In the multi-level interconnect structure 10, the bulk reflective layer 104 is located directly under the patterned test layer 106, and the patterned reflective layer 102 is located directly under the bulk reflective layer 104. In this way, when the optical critical dimension is measured, light may be irradiated to the patterned test layer 106, and the measurement may be performed based on the reflected light. In addition, since the bulk reflective layer 104 and the patterned reflective layer 102 are disposed under the patterned test layer 106, when light enters under the patterned test layer 106, the light may be directly reflected and may not carry noise from the lower layer to ensure the measurement accuracy.

In addition, since the patterned reflective layer 102, which serves as a reflective structure together with the bulk reflective layer 104, is disposed under the bulk reflective layer 104, the problem of light leakage caused by insufficient thickness of the reflective structure may be effectively avoided.

On the other hand, in the present embodiment, the patterned reflective layer 102 includes reflective patterns of different sizes separated from each other, and the ratio of the projected area of the patterned reflective layer 102 on the substrate 100 to the projected area of the bulk reflective layer 104 on the substrate 100 is between 0.75 and 0.90, such that the bulk reflective layer 104 may be effectively prevented from being dished in the subsequent polishing process to ensure the reflective effect.

In the present embodiment, as shown in FIG. 2A, the first reflective pattern 102a includes a plurality of parallel strip patterns 102a-1, and the second reflective pattern 102b includes a plurality of conductive via patterns 102b-1, and the conductive via patterns 102b-1 located between two adjacent strip patterns 102a-1 are arranged in a column, but the present invention is not limited thereto. In other embodiments, the patterned reflective layer 102 may include other types of reflective patterns, which will be described below.

Figure 3:
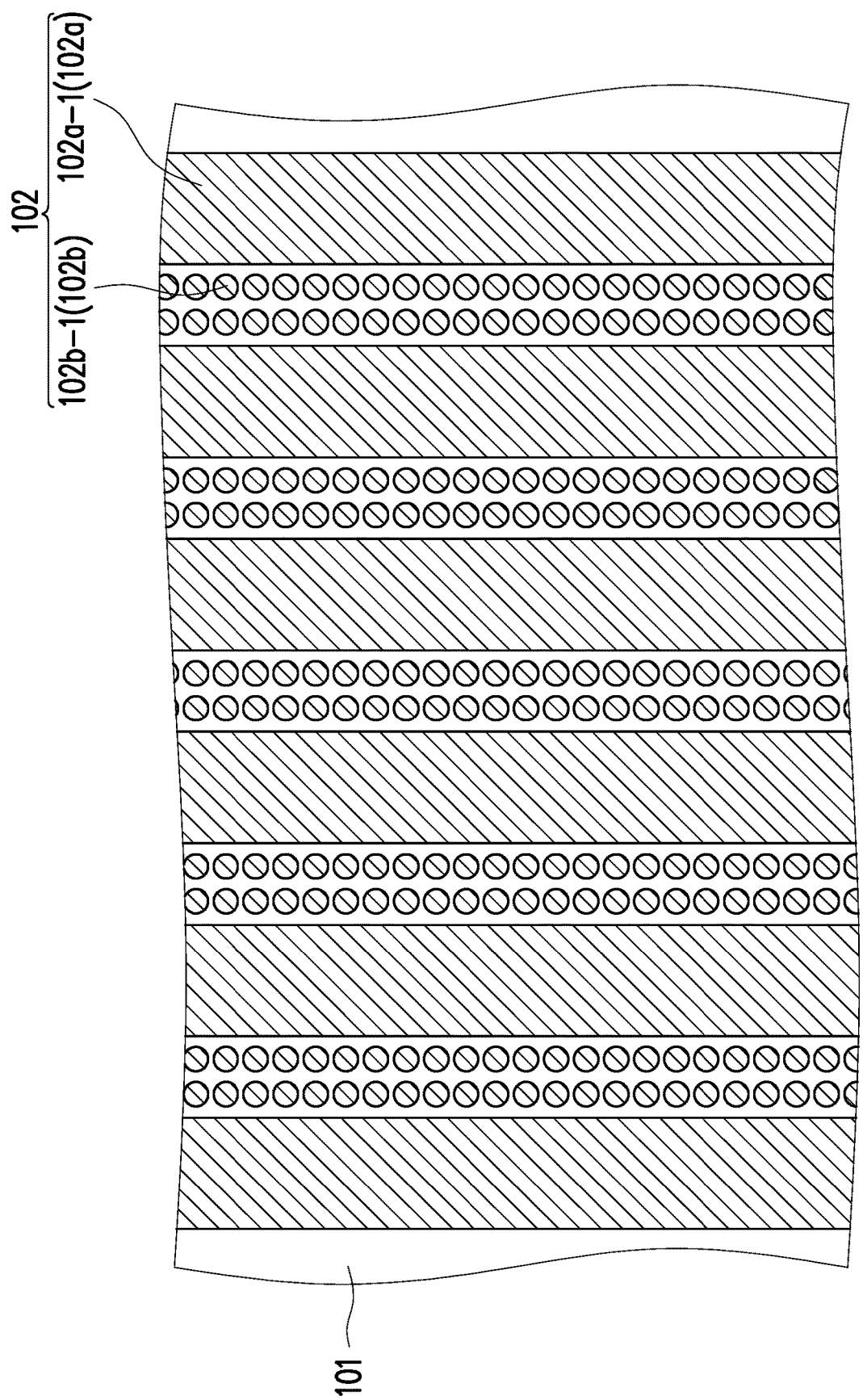
FIG. 3 is a schematic top view of a patterned reflective layer of a multi-level interconnect structure according to a second embodiment of present invention.

FIG. 3 is a schematic top view of a patterned reflective layer of a multi-level interconnect structure according to a second embodiment of the present invention. As shown in FIG. 3, the difference between the patterned reflective layer 102 of the present embodiment and the patterned reflective layer 102 of the first embodiment is that: in the present embodiment, two columns of conductive via patterns 102b-1 are disposed between two adjacent strip patterns 102a-1. In addition, as in the first embodiment, in the present embodiment, the ratio of the projected area of the patterned reflective layer 102 on the substrate 100 to the projected area of the bulk reflective layer 104 on the substrate 100 is between 0.75 and 0.90. According to actual needs, more columns of the conductive via patterns 102b-1 may be disposed between two adjacent strip patterns 102a-1.

Figure 4:
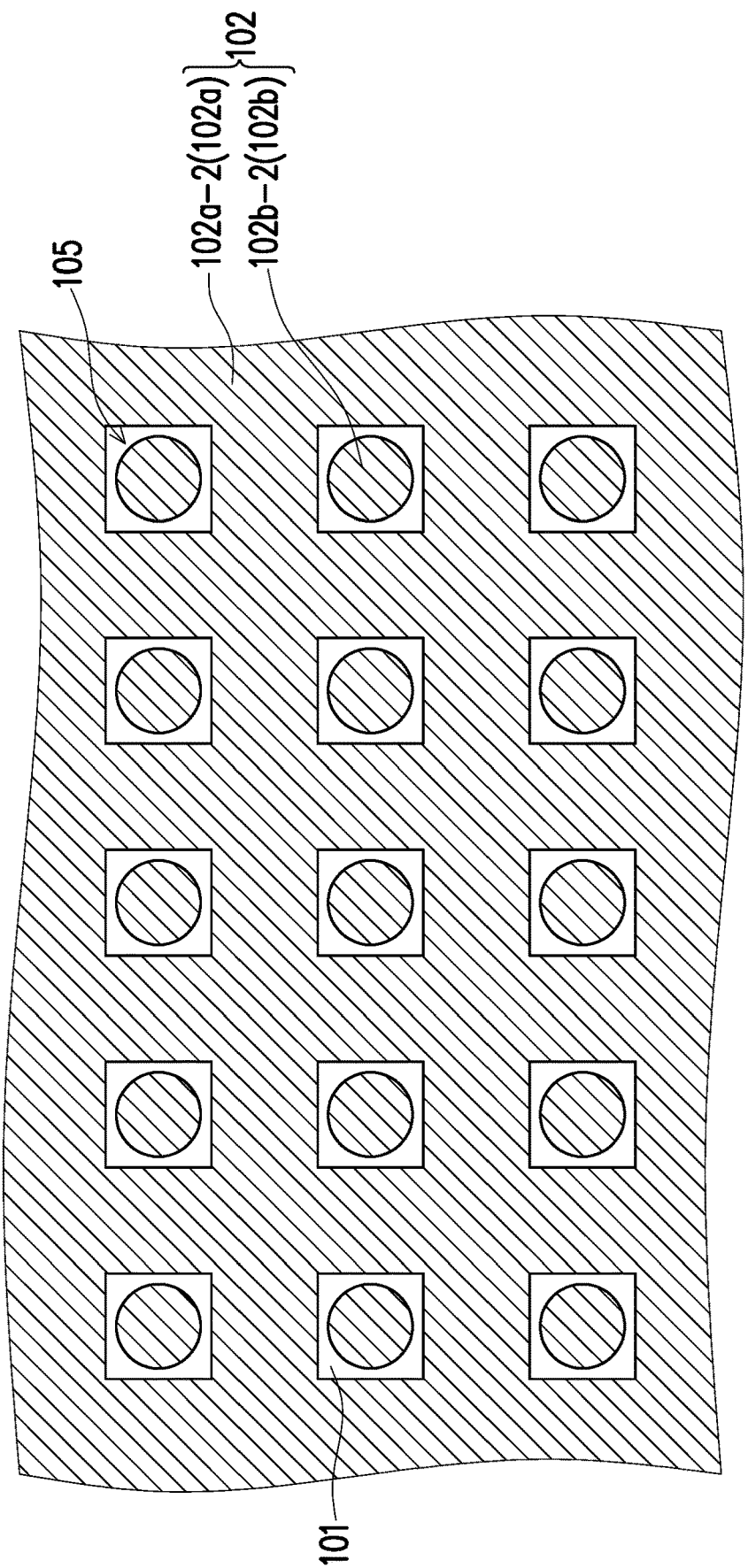
FIG. 4 is a schematic top view of a patterned reflective layer of a multi-level interconnect structure according to a third embodiment of the present invention.

FIG. 4 is a schematic top view of a patterned reflective layer of a multi-level interconnect structure according to a third embodiment of the present invention. As shown in FIG. 4, the difference between the patterned reflective layer 102 of the present embodiment and the patterned reflective layer 102 of the first embodiment is that: in the present embodiment, the first reflective pattern 102a includes a bulk pattern 102a-2 having a plurality of openings 105, the second reflective pattern 102b includes a plurality of conductive via patterns 102b-2, and one conductive via pattern 102b-2 is located in one opening 105. In addition, as in the first embodiment, in the present embodiment, the ratio of the projected area of the patterned reflective layer 102 on the substrate 100 to the projected area of the bulk reflective layer 104 on the substrate 100 is between 0.75 and 0.90. Depending on actual needs, in other embodiments, a plurality of conductive via patterns 102b-2 may be disposed in one opening 105, or the first reflective pattern 102a may include a plurality of bulk patterns 102a-2. In addition, the number and the arrangement of the openings 105 are not limited in the present invention.

Figure 5:
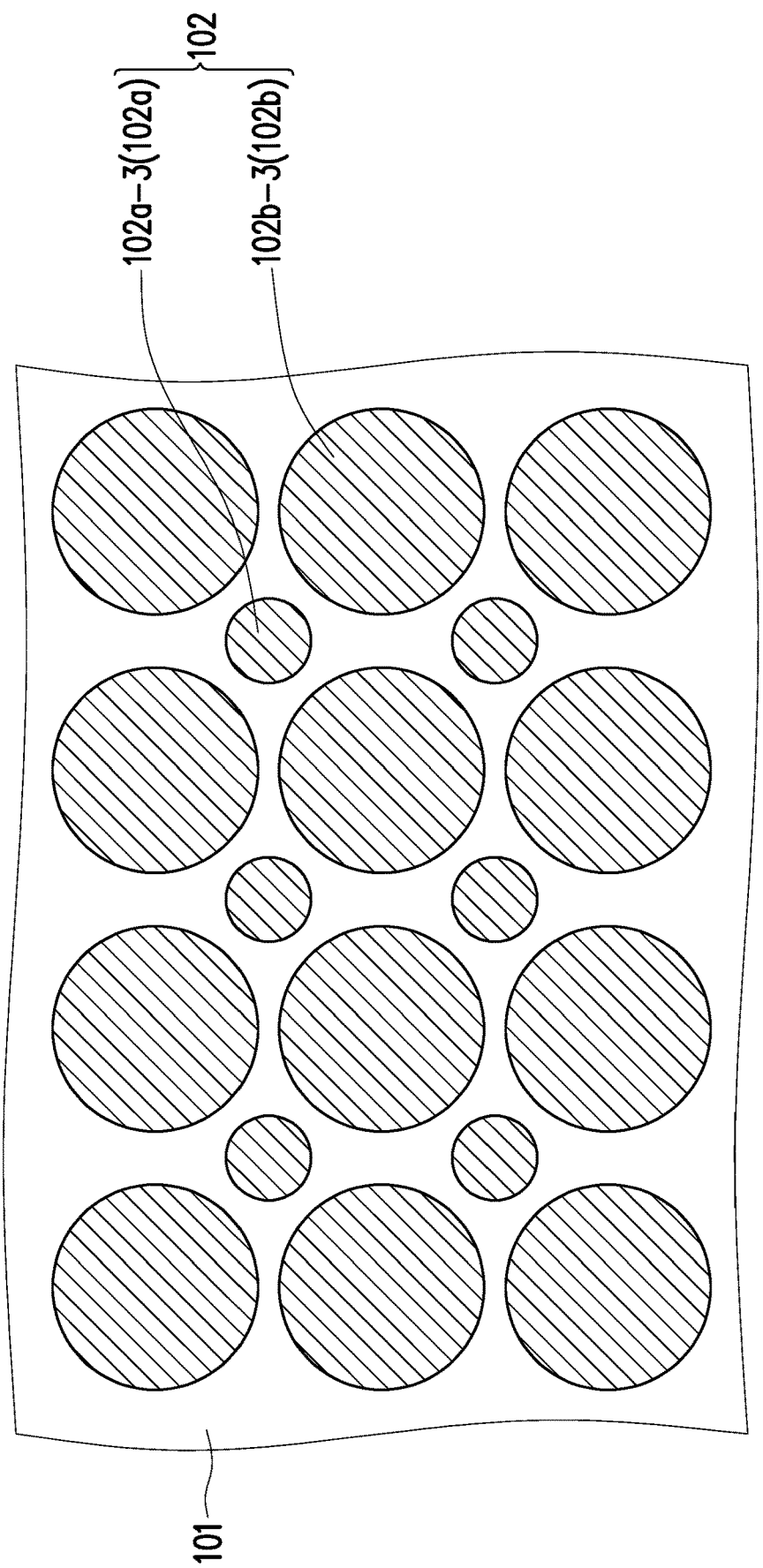
FIG. 5 is a schematic top view of the patterned reflective layer of the multi-level interconnect structure according to a fourth embodiment of the present invention.

FIG. 5 is a schematic top view of a patterned reflective layer of a multi-level interconnect structure according to a fourth embodiment of the present invention. As shown in FIG. 5, the difference between the patterned reflective layer 102 of the present embodiment and the patterned reflective layer 102 of the first embodiment is that: in the present embodiment, the first reflective pattern 102a includes a plurality of first conductive via patterns 102a-3, the second reflective pattern 102b includes a plurality of second conductive via patterns 102b-3, and the aperture of the first conductive via patterns 102a-3 and the aperture of the second conductive via patterns 102b-3 are different from each other. In addition, as in the first embodiment, in the present embodiment, the ratio of the projected area of the patterned reflective layer 102 on the substrate 100 to the projected area of the bulk reflective layer 104 on the substrate 100 is between 0.75 and 0.90.

In the present embodiment, the first conductive via patterns 102a-3 is arranged in an array, the second conductive via patterns 102a-3 are also arranged in an array, and the first conductive via patterns 102a-3 with a smaller aperture are located between adjacent second conductive via patterns 102a-3 with a larger aperture, but the present invention is not limited thereto. In other embodiments, according to actual needs, any arrangement may be used to arrange the first conductive via patterns 102a-3 and the second conductive via patterns 102a-3.

Figure 6:
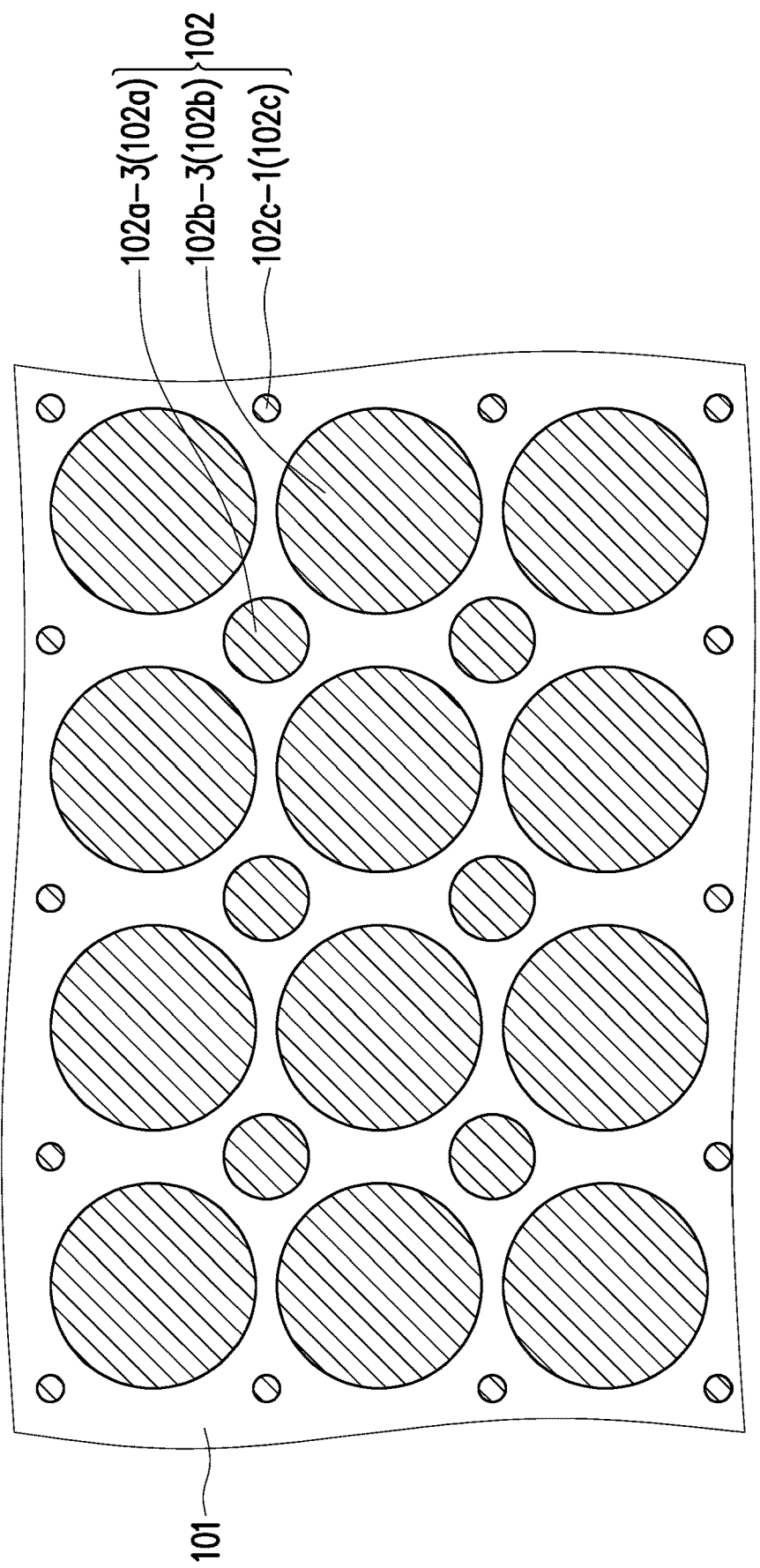
FIG. 6 is a schematic top view of a patterned reflective layer of a multi-level interconnect structure according to a fifth embodiment of the present invention.

FIG. 6 is a schematic top view of a patterned reflective layer of a multi-level interconnect structure according to the fifth embodiment of the present invention. As shown in FIG. 6, the difference between the patterned reflective layer 102 of the present embodiment and the patterned reflective layer 102 of the fifth embodiment is that: in the present embodiment, in addition to the first conductive via patterns 102a-3 and the second conductive via patterns 102b-3, the patterned reflective layer 102 also includes a third reflective pattern 102c including a plurality of third conductive via patterns 102c-1. The aperture of the first conductive via patterns 102a-3, the aperture of the second conductive via patterns 102b-3 and the aperture of the third conductive via patterns 102c-1 are different from each other. In addition, as in the first embodiment, in the present embodiment, the ratio of the projected area of the patterned reflective layer 102 on the substrate 100 to the projected area of the bulk reflective layer 104 on the substrate 100 is between 0.75 and 0.90.

In the present embodiment, the first conductive via patterns 102a-3, the second conductive via patterns 102b-3 and the third conductive via patterns 102c-1 are each arranged in an array. The first conductive via patterns 102a-3 with a smaller aperture are located between adjacent second conductive via patterns 102b-3 with a larger aperture, and the third conductive via patterns 102c-1 with the smallest aperture surround the first conductive via patterns 102a-3 and the second conductive via patterns 102a-3, but the present invention is not limited thereto. In other embodiments, according to actual needs, any arrangement may be used to arrange the first conductive via patterns 102a-3, the second conductive via patterns 102b-3 and the third conductive via patterns 102c-1.

It will be apparent to those skilled in the art that various modifications and variations may be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A multi-level interconnect structure, having a scatterometry test layer, comprising:
   a patterned reflective layer, disposed on a substrate and comprising a first reflective pattern and a second reflective pattern separated from each other;
   a bulk reflective layer, disposed directly on the patterned reflective layer; and
   a patterned test layer, disposed over the bulk reflective layer,
   wherein from a top view of the substrate, a ratio of a projected area of the patterned reflective layer to a projected area of the bulk reflective layer is between 0.75 and 0.90, and
   wherein the first reflective pattern comprises a plurality of first conductive via patterns, the second reflective pattern comprises a plurality of second conductive via patterns, the first conductive via patterns and the second conductive via patterns are arranged in an array, and the first conductive via patterns with a smaller aperture are located between adjacent second conductive via patterns with a larger aperture.

2. The multi-level interconnect structure of claim 1, wherein the patterned reflective layer further comprises a third reflective pattern, the third reflective pattern comprises a plurality of third conductive via patterns, and each of the plurality of first conductive via patterns has a first aperture, each of the plurality of second conductive via patterns has a second aperture and each of the plurality of third conductive vias has a third aperture, and a size of the first aperture, a size of the second aperture and a size of the third aperture are different from each other.

3. The multi-level interconnect structure of claim 1, wherein a material of the patterned reflective layer comprises metal.

4. The multi-level interconnect structure of claim 1, wherein a material of the bulk reflective layer comprises metal.

5. The multi-level interconnect structure of claim 1, wherein the bulk reflective layer is located directly under the patterned test layer, and the patterned reflective layer is located directly under the bulk reflective layer.

6. The multi-level interconnect structure of claim 1, further comprising a dielectric layer disposed between the bulk reflective layer and the patterned test layer.

7. The multi-level interconnect structure of claim 1, further comprising a dielectric layer disposed between the first reflective pattern and the second reflective pattern.

* * * * *